United States Patent [19]
Lebby et al.

[11] Patent Number: 5,848,086
[45] Date of Patent: Dec. 8, 1998

[54] ELECTRICALLY CONFINED VCSEL

[75] Inventors: Michael S. Lebby, Apache Junction; Jamal Ramdani, Gilbert; Wenbin Jiang, Phoenix, all of Ariz.

[73] Assignee: Motorola, Inc., Schaumburg, Ill.

[21] Appl. No.: 762,475

[22] Filed: Dec. 9, 1996

[51] Int. Cl.⁶ .................................................. H01S 3/19
[52] U.S. Cl. ............................................ 372/46; 372/96
[58] Field of Search .................................. 372/46, 96

[56] References Cited

U.S. PATENT DOCUMENTS

| | | | |
|---|---|---|---|
| 5,359,618 | 10/1994 | Lebby et al. | 372/45 |
| 5,446,752 | 8/1995 | Ackley et al. | 372/46 |
| 5,493,577 | 2/1996 | Choquette et al. | 372/46 |
| 5,719,891 | 2/1998 | Jewell | 372/45 |
| 5,729,566 | 3/1998 | Jewell | 372/96 |

*Primary Examiner*—James W. Davie
*Attorney, Agent, or Firm*—Eugene A. Parsons

[57] ABSTRACT

A semiconductive substrate (101) with a surface (102) having a first stack of distributed Bragg reflectors (109) disposed on the surface (102) of the semiconductive substrate (101) that has dot patterned features (252 and 354). A first cladding region (113) is disposed on the first stack of distributed Bragg reflectors (109). An active area (117) is disposed on the first cladding region (113) with a second cladding region (123) disposed on the active area (117). A second stack of distributed Bragg reflectors (127) is disposed on the second cladding region (123). The dot patterned features produce an offset in the stacks of reflectors and a portion of the second stack of distributed Bragg reflectors is oxidized, using the offset, to limit the current path.

16 Claims, 1 Drawing Sheet

ELECTRICALLY CONFINED VCSEL

FIELD OF THE INVENTION

This invention relates, in general, to optical devices and, more particularly, to vertical cavity surface emitting lasers.

BACKGROUND OF THE INVENTION

Recently, there has been interest in a new type of light emitting device called a vertical cavity surface emitting laser (VCSEL). Conventional VCSEL's have several potential advantages, such as a planar construction, emitting light perpendicular to the surface of the die, and the possibility of array fabrication. Development of oxidized aluminum arsenide (AlAs) as a lateral carrier confinement region in a distributed Bragg reflector (DBR) allows for fabrication of sub-mA threshold vertical cavity surface emitting lasers (VCSELs). However, oxidation methods used for generating the lateral carrier confinement regions in a conventional VCSEL present several problems, such as how to control oxidation of the AlAs layers; within the DBR, how to make a fabrication process manufacturable having good yield from wafer to wafer, and the like.

These problems are generally caused by several factors, such as temperature, water vapor pressure, time, and the like that are used in an oxidation process. Because these factors have a large effect on the oxidation of AlAs, control of the oxidation process is difficult. Thus, the lateral confinement regions defined by the oxidation of the AlAs layers vary dramatically from device to device, wafer to wafer, and lot to lot. More specifically, due to fluctuations of the lateral confinement regions, carrier injection paths of some VCSELs may be totally closed because of the cross-over or sealing of the laterally oxidized regions, thus producing die that do not work. In other cases, the VCSEL's may have thresholds that are too high because the carrier injection path is either too wide or too small. Further, diffraction loss is effected, thereby increasing the laser threshold as well. In any of the above cases, manufacturing yield is reduced, and the a manufacturing cost is adversely increased.

It can readily be seen that conventional methods of fabricating the VCSELs with the laterally oxidized carrier confinement regions are not suitable for manufacturing, where the cost effectiveness and the device uniformity is a major concern. Therefore, an article and method that allows controlled oxidation of portions of a VCSEL, and improves manufacturability, simplifies fabrication, and reduces VCSEL manufacturing cost would be highly desirable.

It is a purpose of the present invention to provide a new and improved electrically confined vertical cavity surface emitting laser.

It is another purpose of the present invention to provide new and improved uniform electrically confined vertical cavity surface emitting lasers.

It is still another purpose of the present invention to provide new and improved electrically confined vertical cavity surface emitting laser with improved manufacturability and reduced manufacturing costs.

It is another purpose of the present invention to provide new and improved methods of fabricating electrically confined vertical cavity surface emitting lasers.

SUMMARY OF THE INVENTION

The above problems and others are at least partially solved and the above purposes and others are realized in an electrically confined vertical cavity surface emitting laser including a substrate structure with an opening having a desired shape formed therein. A first stack of distributed Bragg reflectors is disposed on the substrate structure, the first stack of distributed Bragg reflectors including a first plurality of alternating layers with the first plurality of alternating layers covering the opening of the first layer. A first cladding region is disposed on the first stack of distributed Bragg reflectors so as to overlie the opening. An active area, including a first barrier region, a second barrier region, and a quantum well positioned therebetween, is disposed on the first cladding region so as to overlie the opening. A second cladding region is disposed on the active area so as to overlie the opening. A second stack of distributed Bragg reflectors, including a second plurality of alternating layers and a second layer of aluminum arsenide having portions of aluminum oxide, is disposed on the second cladding region overlieng the opening. The second layer is positioned with the portions of aluminum oxide surrounding the opening, thereby confining current carriers to the active area.

BRIEF DESCRIPTION OF THE DRAWINGS

Referring to the drawings.

DESCRIPTION OF THE PREFERRED EMBODIMENTS

Figure 1:
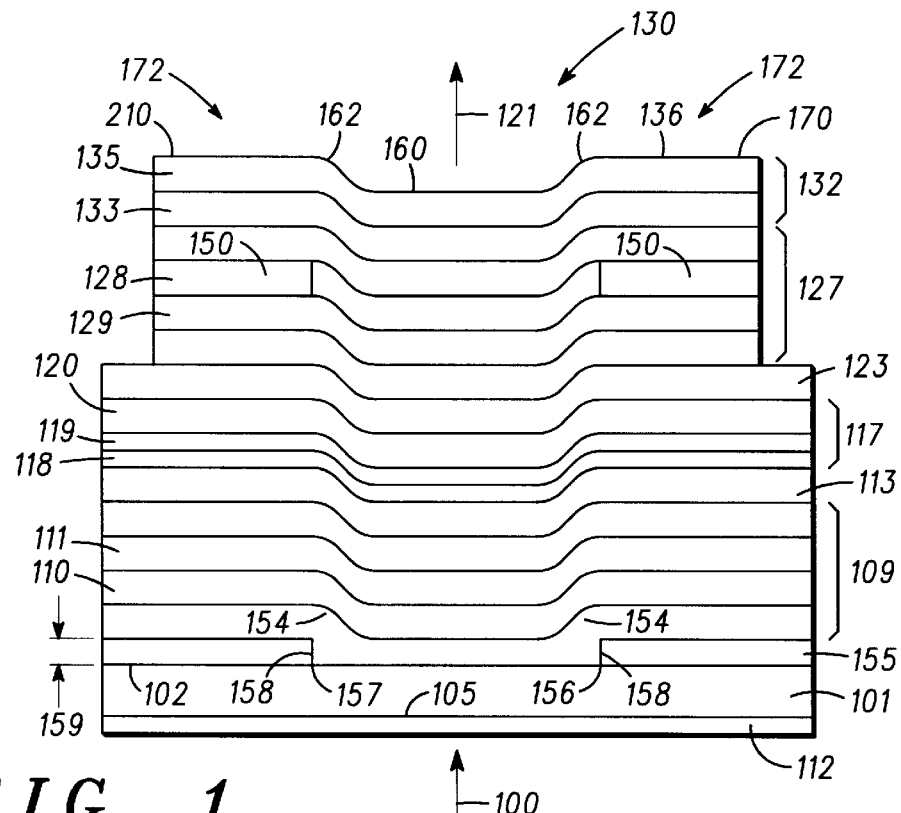
FIG. 1 is an enlarged simplified sectional view of a vertical cavity surface emitting laser in accordance with the present invention.

FIG. 1 is a greatly enlarged simplified sectional view of a vertical cavity surface emitting laser (VCSEL) 100 with a light 121 having a wavelength being emitted therefrom. It should be understood that VCSEL 100 represents any etched type of light emitting device, such as a ridge VCSEL or the like. As shown in FIG. 1, VCSEL 100 is made of several main elements or features, including a ridge 130, a substrate 101 having surfaces 102 and 105, a layer 155 having a feature 156 with an edge 158 and a depth 159, stacks of distributed Bragg reflectors 109 and 127, cladding regions 113 and 123, an active area 117, and contact regions 112 and 132. The stacks of distributed Bragg reflectors 109 and 127 are made of a plurality of alternating layers, illustrated by layers 110 and 111, and layers 128 and 129, respectively. Additionally, layer 128 includes a portion 150 that is oxidized. Active area 117 is illustrated by a quantum well layer 119 and barrier layers 118 and 120 with quantum well layer 119 being positioned between barrier layers 118 and 120. Contact region 132 is illustrated as including layers 133 and 135 with layer 135 having a surface 136.

It should be understood that FIG. 1 is a simplified illustration in which some elements of VCSEL 100 have been purposely omitted to more clearly illustrate the present invention. Further, it should be noted that FIG. 1 is a sectional view and that VCSEL 100 extends into an cut of the figure, allowing VCSEL 100 to represent an array of light emitting devices formed on substrate 101. Additionally, it will be understood by one of ordinary skill in the art that deposition or formation of material layers used to fabricate VCSEL 100 is done sequentially.

VCSEL 100 is fabricated on any suitable substrate 101 providing surface 102. Generally, substrate 101 is made of a semiconductive material, such as a silicon material, a III/V compound material, e.g., gallium arsenide (GaAs), indium phosphide (InP), or the like; however, in a preferred embodiment of the present invention, substrate 101 is made of gallium arsenide.

Generally, feature 156 can be made by any suitable method or technique. One alternative is to form feature 156 in substrate 101. For example, substrate 101 is patterned by any suitable method, such as but not limited to, photolithography, etching, deposition, or the like. By way of example only, a photolithographic pattern is formed on surface 102 of substrate 101. The pattern is then transferred to substrate 101 by reactive ion etching using any suitable etching chemistry such as a halogen based chemistry, e.g., chlorine, fluorine, or the like, thereby forming feature 156 and opening 157 in substrate 101 itself. Additionally, feature 156 can be made in any suitable shape, such as an annular shape, e.g., an oval, a circle, square, finger, or the like; however, in a preferred embodiment of the present invention, the annular shape is formed. Opening 157 defines a continuous step with a current path 160 defined therein. Generally, the diameter of annular opening 157 is used to determine the width of current path 160 with which VCSEL 100 is designed to operate.

Alternatively, feature 156 can be made by positioning layer 155 on surface 102 of substrate 101 and subsequently patterning layer 155. Layer 155 is made of any suitable material or any suitably doped material, such as GaAs, silicon oxide, nitride, doped GaAs, e.g., iron (Fe) doped GaAs, silicon (Si) doped GaAs, or the like. Once layer 155 has been formed, layer 155 is patterned by any suitable method, such as but not limited to, photolithography, etching, deposition, or the like. By way of example only, a photolithographic pattern is formed on layer 155. The pattern is subsequently transferred to layer 155 by reactive ion etching by any suitable etching chemistry such as a halogen based chemistry, e.g., chlorine, fluorine, or the like, thereby forming feature 156 with an opening 157 between first and second islands of layer 155 (as illustrated in FIG. 1). For the remainder of the disclosure, including the claims, layer 155, if present, is hereinafter defined as a portion of a substrate structure so that feature 156 and opening 157 are deemed to be defined by the substrate structure, whether defined by substrate 101 or layer 155.

Opening 157 of feature 156 can be made with any suitable depth 159. Typically, depth 159 is varied depending on the wavelength that VCSEL 100 is designed to emit or operate at. Typically, depth 159 varies from one eighth to one half of the operating wavelength, with a nominal depth being one quarter of the wavelength at which VCSEL 100 is designed to operate. Additionally, opening 157 can have any suitable width ranging from 0.3 micron to 80.0 microns, with a preferred width ranging from 1.0 micron to 50.0 microns, and a nominal width ranging from 3.0 microns to 30.0 microns. The optimal width is considered to be in a range from 5.0 microns to 15.0 microns.

As shown in FIG. 1, VCSEL 100 is made of a plurality of material layers positioned or formed on substrate 101. Generally, the stacks of distributed Bragg reflectors 109 and 127, cladding regions 113 and 123, active area 117, and contact region 132 are epitaxially deposited or formed on or overlying feature 156 and substrate 101 by any suitable epitaxial method, such as molecular beam epitaxy (MBE), metal organic chemical vapor deposition (MOCVD), or the like.

The plurality of material layers generally conform to a contour of feature 156 and substrate 101; however, where edge 158 of feature 156 appears thinning portions 154 are formed in the plurality of material layers. Thus, feature 156 causes a physical step to be defined in each of the subsequently formed plurality of material layers which provides thinning portions 154. This physical step in each of the material layers is positioned between the intended current path region 160 and a surrounding region 172.

As shown in FIG. 1, contact region 112 is disposed on surface 105 of substrate 101. Contact region 112 provides an electrical contact for VCSEL 100. Since contact region 112 is coupled to substrate 101, substrate 101 becomes part of an electrical path to the stack of distributed Bragg reflectors 109. Additionally, it should be understood that contact region 132 is electrically coupled to contact region 112 though the stacks of distributed Bragg reflectors 109 and 127, cladding regions 113 and 123, and active area 117 to inject carriers into VCSEL 100, thereby causing light 121 to be generated and subsequently emitted.

Generally, contact region 112 is made by applying a metal material to surface 105 of substrate 101 and fusing or alloying the metal material into substrate 101, thereby providing an electrical path from contact region 112 to the stack of distributed Bragg reflectors 109. Typically, formation of contact region 112 is one of the last remaining steps in the formation of VCSEL 100; however, it is described here so as to more clearly describe the present invention. Contact region 112 is made by any well-known method or combination of methods in the art, such as deposition (e.g., evaporation, sputtering or the like), heating (e.g., annealing), polishing (e.g., chemical mechanical polishing), or the like. Briefly and by way of example only, a conductive metal is deposited onto surface 105 of substrate 101. After the deposition, a heating step or an anneal step is performed to substrate 101, thereby forming an Ohmic contact between the conductive metal and substrate 101 and electrically coupling the stack of distributed Bragg reflectors 109 to contact region 112 through substrate 101.

However, it should be noted that other alternatives or methods are available for electrically coupling the stack of distributed Bragg reflectors 109 to an electrical source. By way of another example, the stack of distributed Bragg reflectors 109 can be directly coupled by exposing a portion of the stack of distributed Bragg reflectors 109 by any suitable method, such as but not limited to, etching, photolithography, or the like. The exposed area is then metalized to form an electrical contact or Ohmic contact. Thus, the electrical contact formed in this manner provides an area adjacent upper surface 102 to which an electrical bond can be made and thereby electrically coupling VCSEL 100.

The stacks of distributed Bragg reflectors 109 and 127 are made of the pluralities of alternating layers, illustrated by layers 110 and 111 and layers 128 and 129, respectively. The pluralities of alternating layers are made of any suitable materials, such as gallium arsenide/aluminum gallium arsenide (GaAs/AlGaAs), aluminum gallium arsenide having varying amounts of aluminum and gallium ($Al_xGa_{1-x}$/As), indium aluminum gallium phosphide having varying amounts of aluminum and gallium ($In_y(Al_xGa_{1-x})_{1-y}P$), and the like. The material used in making the plurality of alternating layers of the stacks of distributed Bragg reflectors 109 and 127 provides alternating refractive indexes, thereby enabling photons generated from active area 117 to be reflected back and forth between the stacks of distributed Bragg reflectors 109 and 127 and to be amplified. Subsequently, light 121 is emitted from VCSEL 100. Additionally, it should be understood that optical characteristics of materials such as reflectivity are material specific and that different materials will perform differently depending upon the wavelength of light 121 being emitted from VCSEL 100. Thus, the selection of suitable materials is dependent upon material characteristics and the wavelength of light 121 that VCSEL 100 is designed to emit.

The plurality of alternating layers, illustrated by layers 110 and 111 and layers 128 and 129, in the stacks of distributed Bragg reflectors 109 and 127 can have any suitable number of alternating pairs, depending upon the total amount of reflectivity desired. That is, with layers 110 and 111 being one alternating pair and with layers 128 and 129 being another alternating pair, the specific number of alternating pairs can be any suitable number. Generally, the number of alternating pairs can range from fifteen pairs to sixty pairs, with a preferred number ranging from twenty pairs to fifty pairs, and with a nominal number ranging from twenty five pairs to forty pairs.

Doping of the stacks of distributed Bragg reflectors 109 and 127 is done by any suitable n-type dopant and p-type dopant, respectively. However, it should be understood that while one of the stacks of distributed Bragg reflectors 109 and 127 will be selected as being p-typed doped, the other stack of distributed Bragg reflectors will be n-typed doped. Generally, any suitable n-type dopant, such as selenium (Se), silicon (Si), cesium (Cs), or the like, or any suitable p-type dopant, such as carbon (C), zinc (Zn), beryllium (Be), or the like can be used. Concentrations of these dopants can range from $1E15$ $cm^{-3}$ to $1E20$ $cm^{-3}$, with a preferred range from $1E16$ $cm^{-3}$ to $1E20$ $cm^{-3}$, with a nominal range from $1E17$ $cm^{-3}$ to $1E19$ $cm^{-3}$, and with a nominal value of $1E18$ $cm^{-3}$.

Cladding regions 113 and 123 are illustrated as a single layer; however, it should be understood that cladding regions 113 and 123 can be made of a plurality of layers, if desired. Cladding regions 113 and 123 are located with cladding region 113 being on one side of active area 117 and cladding region 123 being on the other side of active area 117. Cladding regions 113 and 123 are made of the material system that is used in active area 117. For example and in accordance with the preferred embodiment of the present invention, if active area 117 is made with an arsine material system, then cladding regions 113 and 123 will be made with an arsine material system. Alternatively, if active area 117 is made with a phosphorous material system, then cladding regions 113 and 123 will be made with a phosphorous material system.

Generally, doping of cladding regions 113 and 123 is dependent upon whether cladding regions 113 and 123 are made of a single layer or a plurality of layers. If cladding regions 113 and 123 are made of a single layer, then cladding regions 113 and 123 are not doped. However, if cladding regions 113 and 123 are made of a plurality of layers, then at least a portion of the plurality of layers of cladding regions 113 and 123 are doped. With cladding regions 113 and 123 being made of a plurality of layers, the doping of the portion to be doped is consistent with its adjacent distributed Bragg reflectors. For example, if the stack of distributed Bragg reflectors 109 is n-typed doped with silicon at a concentration of $1E18$ $cm^{-3}$, then cladding region 113 will be p-typed doped with silicon at a concentration of $1E18$ $cm^{-3}$, thereby matching the doping type and concentration of its adjacent distributed Bragg reflector and transition region.

As shown in FIG. 1, active area 117 is made of barrier layers 118 and 120 with quantum well layer 119 disposed therebetween. However, it should be understood that active area 117 is illustrated in its simplest form and that active area 117 can include a plurality of barrier layers and a plurality of quantum well layers in specific applications or embodiments.

Quantum well layer 119 and barrier layers 118 and 120 are made of any suitable material, such as gallium arsenide, aluminum gallium arsenide, indium gallium phosphide, indium aluminum gallium phosphide, or the like. Selector of materials used in active area 117 is dependent on the wavelength of light 121 chosen for VCSEL 100 to operate at. Additionally, quantum well layer 119 and barrier layers 118 and 120 are made using any suitable thickness; however, in a preferred embodiment of the present invention, the thickness of quantum well layer 119 and barrier layers 118 and 120 range from 50 Angstroms to 125 Angstroms, with a preferred range from 75 Angstroms to 100 Angstroms, and with a nominal value of 100 Angstroms. However, it should be understood that the thickness of active area 117 and cladding regions 113 and 123 is generally approximately one wavelength of light 121 or a multiple thereof.

Contact region 132 typically is made of layers 133 and 135 with the same materials that are used in the stacks of distributed Bragg reflectors 109 and 127. However, while layers 133 and 135 are made of similar materials and dopants as the stack of distributed Bragg reflectors 127, layers 133 and 135 have a higher concentration of dopant to provide for increased conductivity. For example and in accordance with the preferred embodiment of the present invention, if the stacks of distributed Bragg reflectors 109 and 127 are made of AlGaAs, then layers 133 and 135 will be made of aluminum gallium arsenide. However, layers 133 and 135 are more heavily doped than the stacks of distributed Bragg reflectors 109 and 127. Generally, the doping concentration of layer 133 ranges from $1E15$ to $1E20$ $cm^{-3}$, with a preferred range from $1E16$ to $1E20$ $cm^{-3}$, with a nominal range from $1E17$ to $1E19$ $cm^{-3}$, and with a nominal value of $1E18$ $cm^{-3}$ and the doping concentration for layer 135 ranges from $1E17$ to $1E20$ $cm^{-3}$, with a preferred range from $1E18$ to $1E20$ $cm^{-3}$, with a nominal range from $1E19$ to $1E20$ $cm^{-3}$, with a nominal value of $1E19$ $cm^{-3}$.

Once the plurality of material layers have been fabricated on substrate 101, the plurality of material layers are patterned by any suitable method or combination of methods, such as photolithography, etching, deposition, or the like. For example, a dot pattern is aligned and formed by a photolithography process on the plurality of material layers where portions of the material layers are exposed and portions of the material layers are covered by the dot pattern. Generally, the dot pattern or the covered portions are aligned with feature 156. Typically, the dot pattern is larger then feature 156, thereby making VCSEL 100 aligned with feature 156. The dot pattern is then etched by any suitable technique such as dry etching or wet etching where the portions that are exposed by the dot pattern are removed while the covered portions are not removed, thereby making ridge 130. By making ridge 130, edge portions 170 of the stack of distributed Bragg reflectors 127 and contact region 132 are exposed.

In this embodiment, one of the alternating layers in the stack of distributed Bragg reflectors 127, such as layer 128, is made of a material, such as AlAs, AlGaAs, or the like having a higher aluminum (Al) composition or concentration than other layers of the alternating layers in the stack of distributed Bragg reflectors 127, such as layer 129. The layers having the higher composition or concentration of aluminum, such as layer 128, are oxidized at a much faster rate than the layers having a lower composition or concentration of aluminum, such as layer 129, thereby generating portion 150 of oxidized material. Oxidation control of layer 129 is automatically achieved, i.e., slowed or stopped, by thinning portion 154 of layer 129, thereby achieving several advantages. These advantages include but are not limited to, controlling the size of current path 160, reducing variations in current path 160 across the wafer, and improving wafer to wafer uniformity, thereby significantly improving manufacturability of VCSEL 100.

Oxidation of layer 128 generally forms an aluminum oxide complex ($Al_{(x)}O_{(y)}$), e.g. $Al_2O_3$. Oxidation of layer 128 is achieved by any suitable oxidizing method, such as exposure to a heated oxygen source, exposure to a steam source, or the like. Generally, while any suitable temperature or pressure can be used, temperatures range from 200 to 400 degrees Celsius, with a nominal range from 250 to 350 degrees Celsius, and a nominal value of 300 degrees Celsius and pressures range from one atmosphere to ten atmospheres. While oxidation of portion 150 is controlled by thinning portion 154, additional control can be obtained by varying amounts or percent composition of aluminum in layer 128 and by varying process conditions, such as time, temperature, pressure, and oxidation chemistry. A general description of an oxidation process is found in U.S. Pat. No. 5,359,618 which is assigned to the same assignee and which is hereby incorporated by reference. As shown in FIG. 1, current path 160 of VCSEL 100 is confined by thinning portions 154 and portions 150, thereby producing several advantages, such as, but not limited to, improved carrier confinement, decreased series resistance, and the like which improves optical gain and lowers the threshold current of VCSEL 100.

Figure 2:
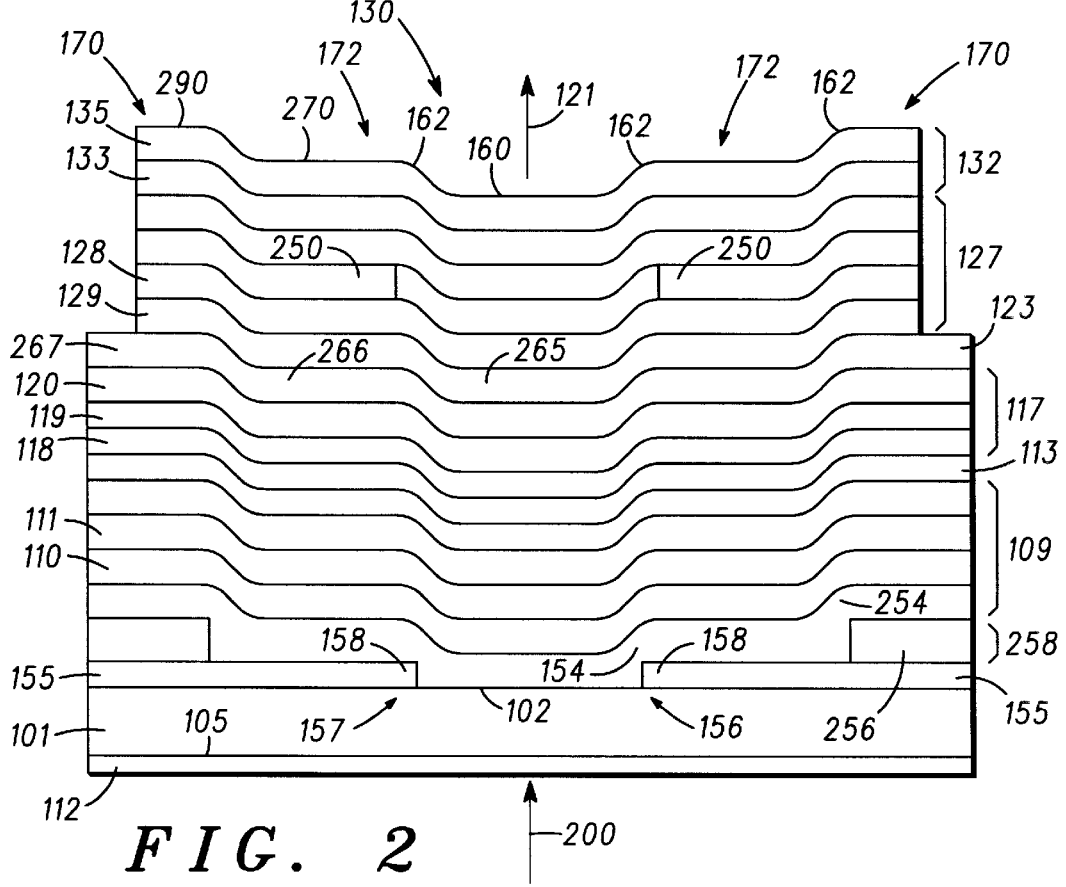
FIG. 2 is an enlarged simplified sectional view of another vertical cavity surface emitting laser in accordance with the present invention.

Turning now to FIG. 2, a greatly enlarged simplified sectional view of a vertical cavity surface emitting laser (VCSEL) 200 in accordance with the present invention is illustrated. It should be understood that similar features or elements used previously with reference to FIG. 1 will retain their original identifying numerals for ease of identification.

As shown in FIG. 2, VCSEL 200 is made with two features 156 and 256. It should be understood that processing methods and techniques previously described also apply to VCSEL 200, however, instead of only forming feature 156 as previously described one of ordinary skill in the art will also be able to form feature 256. Also, for the remainder of the disclosure, including the claims, layer 155 and the layer defining feature 256 are hereinafter defined as a portion of a substrate structure so that feature 156 and feature 256 are deemed to be defined by the substrate structure, whether actually defined by substrate 101 or additional layers positioned on substrate 101. Height or thickness 258 of feature 256 varies depending upon the wavelength at which VCSEL 200 is designed to produce light 121. Typically, height 258 varies from one eighth to one half of the wavelength of the laser emission with a nominal height being one quarter of wavelength. It should be pointed out that the features 156 and 256 are formed into any suitable shape, but typically features 156 and 256 have an annular shape. The diameter of the annular shape for feature 156 is determined by the width of the current path 160 at which VCSEL 200 is designed to operate. The diameter of the annular shape for feature 256 is larger than current path 160.

As previously explained, each of the plurality of material layers deposited over substrate 101 will follow the contour of features 156 and 256, thereby forming thinning portions 154 and 254 in each of the layers. Also, as previously explained, current path 160 is defined by oxidized portion 250, which forms a dielectric material surrounding current path 160. It should be pointed out that since thinning portions 154 and 254 are fabricated as redundant oxidation stops, oxidation of portion 250 can be achieved in severe oxidizing conditions without risking total oxidation of layer 128, thereby affording a much more robust oxidation processing window for defining current path 160, and thereby improving the manufacturability of VCSEL 200.

By way of example, substrate 101 is made of gallium arsenide, with the stacks of distributed Bragg reflectors 109 and 127 based on an arsine material system ($Al_xGa_{1-x}As$). The plurality of alternating layers in at least a portion (e.g. layers 128 and 129) of the stack of distributed Bragg reflectors 127 are made of $Al_xGa_{1-x}As$/AlAs with x varying from 0 to 0.6. The $Al_xGa_{1-x}As$ of layer 128 which is in current path 160 (herein designated portion 265) is surrounded by an AlAs portion of layer 129 (herein designated portion 266) in an inner region 270 (defined as between thinning portions 154 and 254). Portion 266 is in turn surrounded by $Al_xGa_{1-x}As$ of the next lower layer (herein designated portion 267) in an outer region 290 (defined as extending radially outwardly from thinning portion 254). Thus, in each of the layers of the stacks of distributed Bragg reflectors 109 and 127 the portions in current path 160 (e.g. portion 265) are surrounded by material of different reflectivity and portions in region 270 (e.g. portion 266) are surrounded by material of different reflectivity, due to thinning portions (steps) 154 and 254 between current path 160 and inner region 270, and outer region 290, respectively.

By now it should be appreciated that a novel VCSEL and method of fabrication have been disclosed. Which vertical cavity surface emitting laser has improved performance over all. Specifically, by providing controlled lateral oxidized portions in the vertical cavity surface emitting laser, the vertical cavity surface emitting laser becomes manufacturable with improved carrier confinement, a lower resistance, lower threshold current with accompanying improved electrical performance and optical gain, and higher manufacturing yield and reliability.

While we have shown and described several specific embodiments of the present invention, further modifications and improvements will occur to those skilled in the art. We desire it to be understood, therefore, that this invention is not limited to the particular forms shown and we intend in the appended claims to cover all modification that do not depart from the spirit and scope of this invention.

What is claimed is:

1. An electrically confined vertical cavity surface emitting laser comprising:

a substrate structure having a surface with an opening defined therein having a desired shape, the opening defining a current path within a continuous step;

a first stack of distributed Bragg reflectors disposed on the surface of the substrate structure overlying the opening and the continuous step in the surface of the substrate structure;

a first cladding region disposed on the first stack of distributed Bragg reflectors, the first cladding region overlying the opening and the continuous step in the surface of the substrate structure;

an active area disposed on the first cladding region, the active area including a first barrier region, a second barrier region, and a quantum well with the quantum well being positioned therebetween, the active area overlying the opening and the continuous step in the surface of the substrate structure;

a second cladding region disposed on the active area, the second cladding region overlying the opening and the continuous step in the surface of the substrate structure; and a second stack of distributed Bragg reflectors disposed on the second cladding region and overlying the opening and the continuous step in the surface of the substrate structure, the second stack including portions of aluminum oxide, the portions of aluminum oxide being positioned circumferentially adjacent and outside the current path and thereby confining current carriers to the current path.

2. An electrically confined vertical cavity surface emitting laser as claimed in claim 1 wherein the opening is shaped as a circle.

3. An electrically confined vertical cavity surface emitting laser as claimed in claim 1 wherein the opening is shaped as a square.

4. An electrically confined vertical cavity surface emitting laser as claimed in claim 1 wherein the opening is shaped as a finger.

5. An electrically confined vertical cavity surface emitting laser as claimed in claim 1 wherein the substrate structure includes a gallium arsenide supporting substrate.

6. An electrically confined vertical cavity surface emitting laser as claimed in claim 1 wherein the substrate structure includes a supporting substrate and a first layer positioned on the supporting substrate and defining the opening, the first layer including gallium arsenide doped with iron.

7. An electrically confined vertical cavity surface emitting laser as claimed in claim 1 wherein the substrate structure includes a supporting substrate and a first layer positioned on the supporting substrate and defining the opening, the first layer including gallium arsenide doped with silicon.

8. An electrically confined vertical cavity surface emitting laser comprising:
 a substrate structure having a surface with a first island, a second island, and an opening, the first island and the second island being disposed on the surface of the substrate with the opening therebetween and the opening have a width;
 a first stack of distributed Bragg reflectors disposed on the substrate structure, the first stack of distributed Bragg reflectors including a first plurality of alternating layers with the first plurality of alternating layers covering the first island, the second island, and the opening of the first layer;
 a first cladding region disposed on the first stack of distributed Bragg reflectors, the first cladding region covering the first island, the second island, and the opening of the first layer;
 an active area disposed on the first cladding region, the active area including a first barrier region, a second barrier region, and a quantum well with the quantum well being positioned therebetween, the active area covering the first island, the second island, and the opening of the first layer;
 a second cladding region disposed on the active area; and
 a second stack of distributed Bragg reflectors including a second plurality of alternating layers and a second layer of aluminum arsenide having portions of aluminum oxide disposed on the second cladding region and covering the opening, the portions of aluminum oxide encroaching the opening, thereby confining current carriers to the active area.

9. An electrically confined vertical cavity surface emitting laser as claimed in claim 8 wherein the width of the opening is 0.3 micron to 80 microns.

10. An electrically confined vertical cavity surface emitting laser as claimed in claim 8 wherein the width of the opening is 1 micron to 50 microns.

11. An electrically confined vertical cavity surface emitting laser as claimed in claim 8 wherein the width of the opening is 3 microns to 30 microns.

12. An electrically confined vertical cavity surface emitting laser as claimed in claim 8 wherein the width of the opening is 5 micron to 15 microns.

13. An electrically confined vertical cavity surface emitting laser as claimed in claim 8 wherein the substrate structure includes a supporting substrate and a first layer positioned on the supporting substrate and defining the opening, the first layer including silicon doped with a concentration.

14. An electrically confined vertical cavity surface emitting laser as claimed in claim 13 wherein the concentration has a range from 1E15 to 1E20 per cubic centimeter.

15. An electrically confined vertical cavity surface emitting laser as claimed in claim 8 wherein the substrate structure includes a supporting substrate and a first layer positioned on the supporting substrate and defining the opening, the first layer including iron doped with a concentration.

16. An electrically confined vertical cavity surface emitting laser as claimed in claim 15 wherein concentration has a range from 1E15 to 1E20 per cubic centimeter.

\* \* \* \* \*